United States Patent [19]

Schuermeyer et al.

[11] 4,163,985
[45] Aug. 7, 1979

[54] NONVOLATILE PUNCH THROUGH MEMORY CELL WITH BURIED N+ REGION IN CHANNEL

[75] Inventors: Fritz L. Schuermeyer, Yellow Springs; Charles R. Young, Xenia, both of Ohio

[73] Assignee: The United States of America as represented by the Secretary of the Air Force, Washington, D.C.

[21] Appl. No.: 838,437

[22] Filed: Sep. 30, 1977

[51] Int. Cl.² ............................................. H01L 29/78
[52] U.S. Cl. ........................................ 357/23; 357/13; 357/54; 357/59; 307/238; 365/184
[58] Field of Search ................... 365/184; 357/23, 54, 357/13, 59; 307/238

[56] References Cited

U.S. PATENT DOCUMENTS

| | | | |
|---|---|---|---|
| 3,877,054 | 4/1975 | Boulin et al. | 357/54 |
| 3,887,407 | 6/1975 | Ono et al. | 357/54 |
| 3,923,559 | 12/1975 | Sinha | 357/54 |
| 3,936,857 | 2/1976 | Ota | 357/23 |
| 3,996,657 | 12/1976 | Simko et al. | 357/23 |
| 4,000,504 | 12/1976 | Berger | 357/23 |
| 4,010,482 | 3/1977 | Abbas et al. | 357/23 |
| 4,019,198 | 4/1977 | Endo et al. | 357/54 |
| 4,062,037 | 12/1977 | Togei et al. | 357/23 |

OTHER PUBLICATIONS

J. Verwey et al., "Atmos-An electrically Reprogrammable Read-only Memory Device, "IEEE Transon Elec. Dev., vol. ED-21#10, Oct. 1974, pp. 631-635.
W. Johnson, "Multiple Masking Technique in Ion Implantation," IBM Tech. Discl. Bull., vol. 15#2, Jul. 1972, pp. 660-661.

Primary Examiner—Joseph E. Clawson, Jr.
Attorney, Agent, or Firm—Joseph E. Rusz; Robert Kern Duncan

[57] ABSTRACT

A nonvolatile memory cell is disclosed that has a buried n+ layer from which charge (electrons) is injected into the insulator of n-channel MNOS (Metal Nitride Oxide Semiconductor) type devices.

3 Claims, 6 Drawing Figures

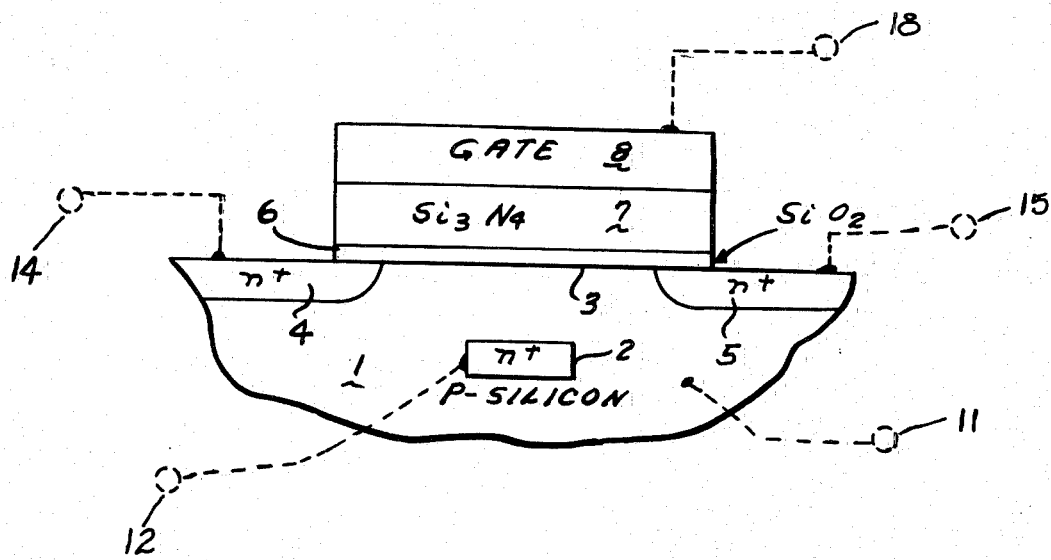

NONVOLATILE PUNCH THROUGH MEMORY CELL WITH BURIED N+ REGION IN CHANNEL

RIGHTS OF THE GOVERNMENT

The invention described herein may be manufactured and used by or for the Government of the United States for all governmental purposes without the payment of any royalty.

BACKGROUND OF THE INVENTION

The field of the invention is in the semiconductor art and more particularly in the art of MNOS LSI memory arrays.

MNOS memory devices have important applications in missiles, aircraft guidance systems, communications, radar, and as program stores in small computers. Generally, the prior art devices have required large numbers of decoder devices to operate at relatively high voltages (i.e., 25–30 V), which are expensive to fabricate and frequently unreliable in operation, and subject to early failure due to defects and weak areas.

The best known prior art is that of U.S. Pat. No. 3,996,657 to patentees Simko et al, and U.S. Pat. No. 4,017,888 to patentees Christie et al, and "Avalanche Injection and Near Avalanche Injection of Charge Carriers into $SiO_2$" by Verwey and Hering in IEEE Transactions on Electron Devices, Vol. ED 24, p 519–523, 1977.

SUMMARY OF THE INVENTION

The invention provides a nonvolatile semiconductor memory suitable with low voltage peripheral electronics in n-channel technology. The invention also provides memory cell structure which does not require large numbers of decoder devices to operate at relatively high voltages. One external (off chip) switching device can be used for an entire LSI memory chip to switch the high voltage and thus can be a specific high-voltage discrete device. Thus, a major cost factor in fabrication has been eliminated as well as a major failure point. This results in a much more reliable array. An idea of the cost savings brought about by this invention is realized by considering that typical prior art plated wire devices cost approximately $0.73/bit to MNOS device while devices as disclosed herein are produced for approximately $0.005/bit. In a modern weapon system requiring several megabits of this kind of memory, this is a very sizeable savings.

This invention is a nonvolatile semiconductor data storage cell that may typically be utilized in LSI memory arrays. The device represents an improvement to the known MNOS type devices. It is based on an n-channel technology. The device is different from the known MNOS type devices by possessing a buried n+ layer. For writing of the device, punch through is achieved between the n+ layer and the surface layer thereby injecting charge (electrons) from the buried layer through the inversion layer into the insulator. When the potential of the surface layer is more than the threshold voltage drop below the gate voltage, an inversion layer exists and punch through occurs between the inversion layer and the n+ injector. Part of the punch through current is injected into the insulator, altering the threshold voltage. The remaining part of the punch through current is collected by the inversion layer and conducted to the source and drain. When the potential of the surface layer is less than the threshold voltage drop below the gate voltage no inversion layer exists. However, again part of the punch through current is injected into the insulator, altering the threshold voltage while the remaining punch through current is conducted to the source and the drain. Erasing is achieved by applying a large positive voltage to the buried layer. Reading of the device is identical to that of typical MNOS type transistors.

Figure 1:
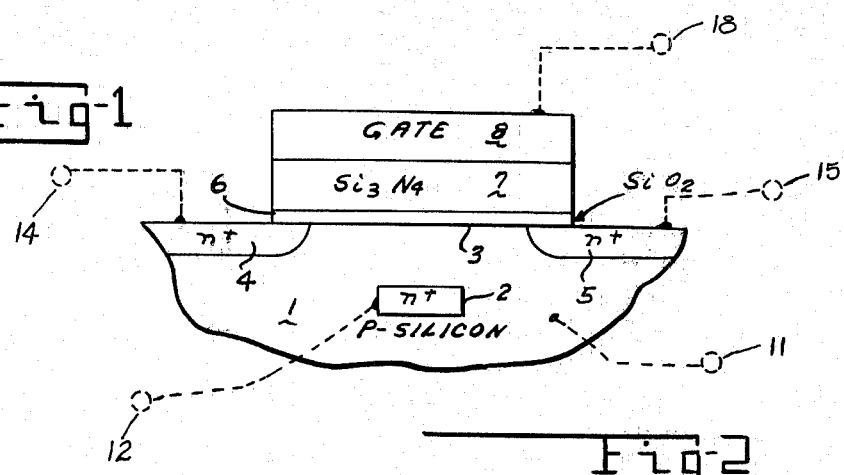
FIG. 1 schematically illustrates structure comprising a typical embodiment of the invention.

FIG. 1 discloses the basic structure for charge injection into the insulator of MNOS type devices. The structure is conventionally fabricated in p type silicon 1 and contains an n+ injector 2 which is buried below the surface 3 of the semiconductor. It contains n+ diffusions 4 and 5 which are typical source and drains, it contains the vertically justipositioned double dielectric structure, here represented by $SiO_2$ layer 6 and $Si_3N_4$ layer 7, and the gate 8. In operation, the device is first cleared by applying a negative pulse (typically −25 V for 10 msec) to gate 8 while all other terminals, i.e., elements having external connections, represented schematically by the phantom connections 11, 12, 14, 15, and 18 to, respectively, the substrate 1, the injector 2, the source 4, the drain 5, and the gate 8, of the device are at ground level. Alternatively, an approximately +30 V, 10 msec pulse may be applied to the injector 2 with gate 8 at 0 V potential for clearing; this will cause punch through from injector 2 to the surface 3 and the applied voltage (30 V) minus the punch through voltage $V_{PT}$ (approximately 5 V) will appear across the insulator (6 plus 7). This process is similar to the erasing of conventional MNOS type devices by applying high voltage across the insulator, causing the device to assume a negative or very small positive threshold voltage. Writing is performed by applying approximately +10 V to both gate 8 and the n+ regions 4 and 5 while the injector 2 and substrate 1 are kept at ground level. This voltage pattern will cause punch through between the n+ injector 2 and the surface 3, causing electrons to be emitted from the injector 2 which are accelerated towards surface 3 and then, as is known in the art, possess a probability to penetrate through the oxide layer 6 and be stored in nitride layer 7 close to the $SiO_2$-$Si_3N_4$ interface. This writing process causes the threshold voltage of the device to assume a potential which is more positive than its value was before writing. Write inhibit (a feature important for memory arrays) is achieved by applying the same potentials to the device with the exception of keeping either one or both n+ areas 4 and 5 at ground potential. This causes the channel potential to be at ground potential and consequently no punch through between channel and injector occurs. The threshold voltage of the device is sensed in the modes, as is conventionally done in MNOS type structures.

The invention is also applicable to substrate isolation technology as currently used for MNOS structure, to apply a positive voltage to the substrate of the MNOS device from an on-chip control element for erasure.

Typical punch through voltage requirements are in the order of 5 to 10 volts. This punch through voltage can be achieved, e.g., with a 2 μm distance between the top of the injector 2 and the silicon surface 3 with a p-substrate doping concentration of $2 \times 10^{15}$ cm$^{-3}$.

Figure 2:
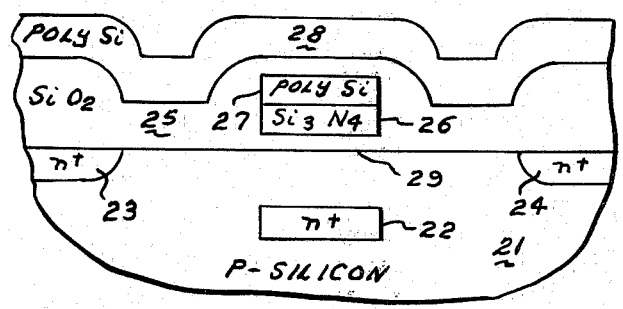
FIG. 2 schematically illustrates the invention in another MNOS structure.

Another embodiment utilizing the injector is shown in FIG. 2. Typically, here again p-silicon 21 is used as substrate. The injector is a buried layer of n+ doping 22. 23 and 24 are n+ diffusions. Layer 25 is an SiO$_2$ layer with different thickness across the structure. The center part, which is shown below the Si$_3$N$_4$ layer 26 is a very thin oxide (i.e., 100 Å or less). The oxide located between layer 26 and diffusions 23 and 24 horizontally is 1000 Å thick typically. The oxide above diffusions 23 and 24 is 10,000 Å thick typically. Layer 27 is a polysilicon film forming a gate. This gate is shown to be located on top of the Si$_3$N$_4$ layer 26 film and is surrounded by a relatively thick (10,000 Å thick typically) SiO$_2$ layer 25. Layer 28 is another gate layer which is typically poly Si or an Al layer. Layer 28 forms the gate to the areas where the 1000 Å SiO$_2$ films are located. In this structure, reading and write/write-inhibit are controlled by gate 28; consequently, all gates 27 on a chip (for instance a 16K bit chip) may be connected with each other and the positive ($+10$ V) and negative write voltages ($-25$ V) may be applied externally. The operation of a cell is as follows: To erase the device a $-25$ V, 10 msec pulse is applied to gate 27 with respect to substrate 21. To write the device, $+10$ V is applied to diffusions 23 and 24, and gates 27 and 28 while keeping substrate 21 and injector 22 at ground level. This will cause punch through between the channel, which is generated at interface 29 due to the field conditions, and the injector 22. Consequently, electrons are injected into the Si$_3$N$_4$ layer 26 where they are stored and represent information. The writing can be inhibited by either of two procedures. All voltage levels are identical to the above case with the exception of having 0 V potential at diffusion 23 and/or diffusion 24. This procedure causes the channel to be at 0 V potential and no punch through occurs. The second procedure requires timing with 0 V at diffusions 23 and 24, gate 28 is pulsed to $+10$ V and during this pulse time, a 10 V potential is applied to layer 27. This process causes an inversion layer to exist below the Si$_3$N$_4$ layer 26 area at 0 V potential. After gate 28 returns to 0 V potential the potential on diffusions 23 and 24 may be altered without affecting the write inhibit. Now a different line in an array can be written without altering the threshold voltage of the write inhibited line. Reading is performed by applying a read voltage to gate 27 and then applying a 10 V pulse to gate 28 and during this pulse time monitoring the current between diffusions 23 and 24.

Figure 3:
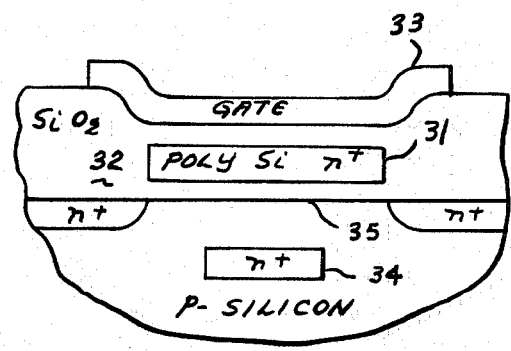
FIG. 3 schematically illustrates a typical floating gate structure embodiment of the invention.

Standard MOS and MNOS technologies are utilized in fabricating this structure. For instance, well known ion implantation techniques can be used to adjust the threshold voltage and the punch through voltage of the different areas. The device will typically be used in large arrays, such as 4K bits per chip with decode, sense and timing circuitry on chip. These circuits are well known in conventional MOS and MNOS circuits. The injection concept is not limited to the MNOS structure but may also be applied to the floating gate structure, the MAOS, the interface doped structure and others. It may also be applied to the NOVCID structures. FIG. 3 illustrates schematically an embodiment having a floating gate 31 in an SiO$_2$ layer 32 below gate 33. The injector is the n+ layer 34. Punch through between injector 34 and the n-channel formed at the surface 35 is as previously discussed.

Figure 4:
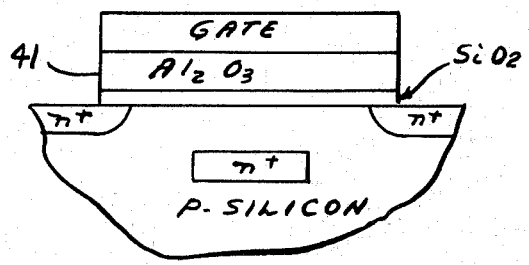
FIG. 4 schematically illustrates a typical MAOS embodiment of the invention.

An embodiment of the invention in an MAOS (Metal, Aluminum (Oxide), (Silicon) Oxide, Semiconductor) structure is illustrated schematically in FIG. 4. This is substantially similar to structure as illustrated in FIG. 1, except with the Silicon Nitride (Si$_3$N$_4$) layer replaced with an Aluminum Oxide (Al$_2$O$_3$) layer 41. Generally, MAOS structures are referred to as though a type of MNOS structure, and included in the general definition of MNOS devices.

Figure 5:
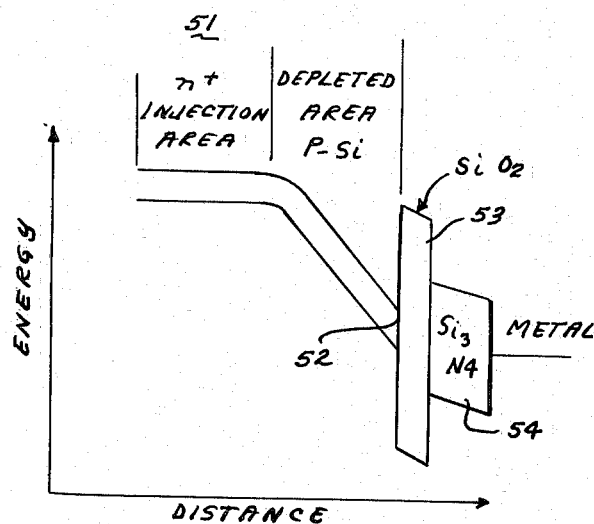
FIG. 5 is an illustration showing a typical energy band diagram representative of embodiments of the invention.

FIG. 5 illustrates a typical band-gap energy diagram of typical embodiments of the invention. Referring to both FIGS. 1 and 5, electrons from the n+ injection area 2, 51 are accelerated toward the SiO$_2$ interface 3, 52. Energy is lost due to electron phonon interactions. Electrons arriving at the interface are not monoenergetic but their energy is distributed. Only electrons with sufficient energy are injected into the SiO$_2$ layer 6, 53 and are trapped at the SiO$_2$-Si$_3$N$_4$ interface or in the Si$_3$N$_4$ layer 7, 54.

Figure 6:
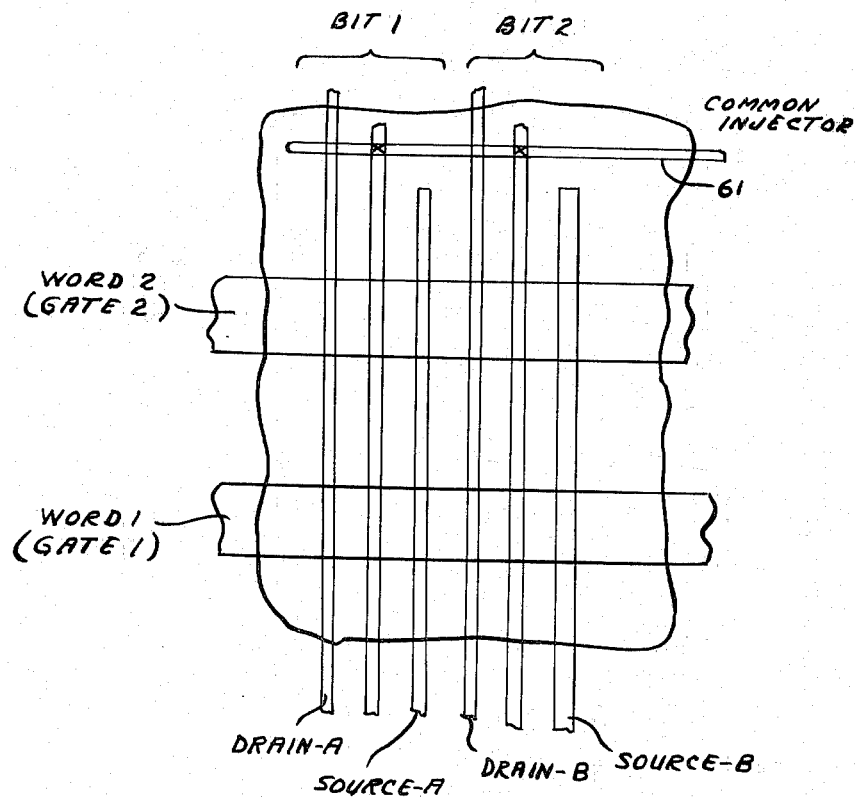
FIG. 6 is a schematic-plan representation of a small portion of an LSI device showing four cells.

FIG. 6 schematically shows a partial plan diagram of a typical LSI chip layout illustrating a common injector tie connection 61 for common control of all buried n+ injector layers. It also shows the common source and drain lines in the columns and the common gate lines in the rows, referring to the device in FIG. 1. Referring to the device in FIG. 2, the word lines represent layer 28, the Poly Silicon layer 27 is common to all devices in the array.

We claim:

1. A five terminal nonvolatile punch through memory cell comprising:
   a. a p type substrate having a surface;
   b. a first and a second n+ region positioned in spaced apart relationship in the said substrate providing a source and a drain, respectively;
   c. a very thin oxide layer positioned over a portion of said substrate surface in contacting relationship;
   d. nitride layer positioned over the said oxide layer in contacting relationship;
   e. a gate layer positioned over the said nitride layer; and
   f. an n+ layer buried in the said p type substrate below the said surface of the substrate and substantially between and in spaced apart relationship to the said first and second n+ regions.

2. A nonvolatile punch through transistor memory cell comprising:
   a. a p type substrate having a surface;
   b. a first and a second n+ diffusion area positioned in the said substrate providing, respectively, a source and a drain;
   c. a vertically justapositioned double dielectric including a very thin oxide layer, the said oxide layer positioned on the surface of the substrate; and
   d. an isolated n+ region buried in the said substrate below the said surface for injecting charge into the said double dielectric.

3. A nonvolatile punch through transistor memory cell comprising:
   a. a p type silicon substrate having a surface;

b. a silicon dioxide layer positioned on the surface of the said substrate;
c. a silicon nitride layer positioned in cooperation with the said silicon dioxide layer to provide a silicon dioxide thickness between the substrate surface and the said silicon nitride layer less than approximately 100 Angstroms;
d. a gate layer positioned on the said silicon nitride layer providing a gate terminal;
e. a first n+ diffusion region positioned in the said substrate horizontally to one side of the position of the said silicon nitride layer, providing a source element terminal;
f. a second n+ diffusion region positioned in the said substrate in horizontal spaced apart relationship to the said first n+ diffusion region and positioned to the other side of the position of the said silicon nitride layer, providing a drain element terminal; and
g. an n+ region positioned approximately 2 microns below the surface of the said substrate, positioned in horizontal spaced apart relationship between the said source and drain elements and in a vertical relationship substantially below the said silicon nitride layer providing a terminal for injecting charge whereby punch through of electrons from the n+ buried region through the said substrate and the said silicon dioxide layer provides a nonvolatile charge in the said silicon nitride layer.

* * * * *